United States Patent
Lazar et al.

(10) Patent No.: US 9,941,846 B2
(45) Date of Patent: *Apr. 10, 2018

(54) POWER SUPPLIES

(71) Applicant: Sonos, Inc., Santa Barbara, CA (US)

(72) Inventors: James F. Lazar, Moorpark, CA (US); Mark Polomski, Santa Barbara, CA (US)

(73) Assignee: SONOS, INC., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/342,959

(22) Filed: Nov. 3, 2016

(65) Prior Publication Data

US 2017/0077880 A1    Mar. 16, 2017

Related U.S. Application Data

(63) Continuation of application No. 14/488,919, filed on Sep. 17, 2014, now Pat. No. 9,520,850, which is a
(Continued)

(51) Int. Cl.
| | |
|---|---|
| *H04R 29/00* | (2006.01) |
| *H03F 3/183* | (2006.01) |
| *H03G 3/10* | (2006.01) |
| *H03G 3/30* | (2006.01) |
| *H03F 1/02* | (2006.01) |

(Continued)

(52) U.S. Cl.
CPC .......... *H03F 3/183* (2013.01); *H03F 1/0222* (2013.01); *H03F 1/305* (2013.01); *H03F 3/21* (2013.01); *H03G 3/10* (2013.01); *H03G 3/301* (2013.01); *H04R 27/00* (2013.01); *H04R 29/001* (2013.01); *H03F 2200/03* (2013.01);
(Continued)

(58) Field of Classification Search
CPC ........ H03G 3/10; H03G 3/301; H03F 1/0222; H03F 3/183; H03F 3/21; H03F 2200/03; H04R 29/001
USPC .................... 381/58; 330/251, 279, 285, 297
See application file for complete search history.

(56) References Cited

U.S. PATENT DOCUMENTS

| | | | |
|---|---|---|---|
| 5,270,657 A | 12/1993 | Wirth et al. | |
| 5,440,644 A | 8/1995 | Farinelli et al. | |

(Continued)

FOREIGN PATENT DOCUMENTS

| | | |
|---|---|---|
| EP | 1389853 A1 | 2/2004 |
| WO | 2003093950 A2 | 11/2003 |

OTHER PUBLICATIONS

Final Office Action dated Nov. 9, 2011, issued in connection with U.S. Appl. No. 11/761,342, filed Jun. 11, 2007, 21 pages.
(Continued)

*Primary Examiner* — Melur Ramakrishnaiah

(57) ABSTRACT

Techniques for providing multiple power supplies in electronic devices are disclosed. According to one aspect of the present invention, an appropriate power supply is provided only to accommodate a volume setting. In other words, there are at least two power supplies, one with a low voltage and the other with a high voltage. The high voltage power supply is only applied when there is a need to accommodate a volume setting. Thus the power consumption of the amplifiers is well controlled. As a result, the designs of the device and heat dissipation therein can be simplified and lowered in cost.

20 Claims, 4 Drawing Sheets

Related U.S. Application Data continuation of application No. 13/565,241, filed on Aug. 2, 2012, now Pat. No. 8,867,761, which is a continuation of application No. 11/761,342, filed on Jun. 11, 2007, now Pat. No. 8,258,872.

(51) Int. Cl.
*H03F 3/21* (2006.01)
*H03F 1/30* (2006.01)
*H04R 27/00* (2006.01)

(52) U.S. Cl.
CPC .... *H03F 2200/507* (2013.01); *H04R 2420/03* (2013.01); *Y10T 307/653* (2015.04); *Y10T 307/696* (2015.04)

(56) References Cited

U.S. PATENT DOCUMENTS

| | | | |
|---|---|---|---|
| 5,761,320 | A | 6/1998 | Farinelli et al. |
| 5,898,340 | A | 4/1999 | Chatterjee et al. |
| 6,032,202 | A | 2/2000 | Lea et al. |
| 6,311,279 | B1 | 10/2001 | Nguyen |
| 6,469,633 | B1 | 10/2002 | Wachter |
| 6,778,869 | B2 | 8/2004 | Champion |
| 7,196,584 | B2 | 3/2007 | Harris |
| 7,295,548 | B2 | 11/2007 | Blank et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,733,658 | B1 | 6/2010 | Perkins, III et al. |
| 7,853,341 | B2 | 12/2010 | McCarty et al. |
| 7,987,294 | B2 | 7/2011 | Bryce et al. |
| 8,045,952 | B2 | 10/2011 | Qureshey et al. |
| 8,103,009 | B2 | 1/2012 | McCarty et al. |
| 8,234,395 | B2 | 7/2012 | Millington et al. |
| 8,258,872 | B1 | 9/2012 | Lazar et al. |
| 8,483,853 | B1 | 7/2013 | Lambourne |
| 8,527,688 | B2 | 9/2013 | Chatterjee et al. |
| 8,712,324 | B2 | 4/2014 | Corbridge et al. |
| 8,867,761 | B2 | 10/2014 | Lazar et al. |
| 2002/0124097 | A1 | 9/2002 | Isely et al. |
| 2007/0142944 | A1 | 6/2007 | Goldberg et al. |
| 2008/0044041 | A1* | 2/2008 | Tucker ............... H02M 3/07 381/120 |
| 2008/0144861 | A1 | 6/2008 | Melanson et al. |
| 2009/0184584 | A1 | 7/2009 | Hermann et al. |
| 2010/0225270 | A1 | 9/2010 | Jacobs et al. |
| 2012/0177226 | A1 | 7/2012 | Silverstein et al. |
| 2014/0022084 | A1 | 1/2014 | Drimusz et al. |

OTHER PUBLICATIONS

"Final Office Action dated Dec. 31, 2013, issued in connection with U.S. Appl. No. 13/565,241, filed Aug. 2, 2012, 20 pages".
Non-Final Office Action dated Apr. 5, 2011, issued in connection with U.S. Appl. No. 11/761,342, filed Jun. 11, 2007, 22 pages.
"Non-Final Office Action dated Apr. 10, 2013, issued in connection with U.S. Appl. No. 13/565,241, filed Aug. 2, 2012, 22 pages".
Non-Final Office Action dated May 10, 2016, issued in connection with U.S. Appl. No. 14/488,919, filed Sep. 17, 2014, 10 pages.
Notice of Allowance dated May 2, 2012, issued in connection with U.S. Appl. No. 11/761,342, filed Jun. 11, 2007, 19 pages.
Notice of Allowance dated Sep. 13, 2016, issued in connection with U.S. Appl. No. 14/488,919, filed Sep. 17, 2014, 5 pages.
Notice of Allowance dated Jun. 23, 2014, issued in connection with U.S. Appl. No. 13/565,241, filed Aug. 2, 2012, 21 pages.
"Pre-Brief Conference Decision dated May 1, 2014, issued in connection with U.S. Appl. No. 13/565,241, filed Aug. 2, 2012, 3 pages".
AudioTron Quick Start Guide, Version 1.0.
AudioTron Reference Manual, Version 3.0.
AudioTron Setup Guide, Version 3.0.
Jo et al., "Synchronized One-to-many Media Streaming with Adaptive Playout Control," Proceedings of SPIE, 2002, pp. 71-82, vol. 4861.
"Denon 2003-2004 Product Catalog," Denon, 2003-2004, 44 pages.
United States Patent and Trademark Office, U.S. Appl. No. 60/490,768 filed Jul. 28, 2003, entitled "Method for synchronizing audio playback between multiple networked devices," 13 pages.
United States Patent and Trademark Office, U.S. Appl. No. 60/825,407 filed Sep. 12, 2003, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

FIG. 3B             FIG. 3C

POWER SUPPLIES

CROSS REFERENCE TO RELATED APPLICATION

This application claims the benefit of priority as a continuation under 35 U.S.C. § 120 to U.S. patent application Ser. No. 14/488,919 entitled "Power Supplies" filed on Sep. 17, 2014, which claims the benefit of priority as a continuation to U.S. patent application Ser. No. 13/565,241 entitled "Multi-Tier Power Supply for Audio Amplifiers" filed on Aug. 2, 2012 and issued on Oct. 21, 2014 as U.S. Pat. No. 8,867,761, which claims the benefit of priority as a continuation to U.S. patent application Ser. No. 11/761,342 entitled "Multi-Tier Power Supply for Audio Amplifiers" filed on Jun. 11, 2007 and issued on Sep. 4, 2012 as U.S. Pat. No. 8,258,872, each of which is hereby incorporated by reference in its entirety for all purposes.

BACKGROUND OF THE INVENTION

Field of the Invention

The invention is generally related to the area of consumer electronics. In particular, the invention is related to method and apparatus for automatically coupling an appropriate voltage or power supply to an audio amplifier in a system in responding to a volume so as to increase the efficiency of the system.

The Background of Related Art

An electronic amplifier is a device for increasing the power of a signal. It achieves this amplification by taking power from a power supply and controlling the output to match the input signal but with gain. An idealized amplifier may be said to be "a piece of wire with gain", as the output is an exact replica of the input, but larger.

Many electronic devices usually contain one or more amplifiers to energize audio signals before the audio signals are sent to speakers for sound reproduction. Ideally, the more amplifiers there are, the better the sound can be reproduced from the audio signals. Practically, there are many limitations in a device that limit the use of the amplifiers or power supplies. Examples of these limitations include physical dimensions, weight, costs, power consumption, and heat dissipation. Depending on application of an electronic device, appropriate amplifiers shall be designed and operate with appropriate power supply. Thus, there is always a need for efficient designs in an audio system that produces the best audio quality possible without going beyond physical design limitations.

SUMMARY OF THE INVENTION

This section is for the purpose of summarizing some aspects of the present invention and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present invention.

In general, the present invention pertains to the designs of electronic devices that reproduce sounds. The electronic devices employ one or more audio amplifiers energized by a power supply. According to one aspect of the present invention, an appropriate power supply is provided only to accommodate a volume setting. In other words, there are at least two power supplies, one with a low voltage and the other with a high voltage. The high voltage power supply is only applied when there is a need to accommodate a volume setting. Thus the power consumption of the amplifiers is well controlled. As a result, the designs of the device and heat dissipation therein can be simplified and lowered in cost.

According to another aspect of the present invention, a set of supply voltages is provided together with a controller. The controller is configured to determine which one of the supply voltages shall be applied to an amplifier in accordance with a volume that may be from a volume setting or volume signal. Depending on implementation, the controller may be a circuit or may execute a software module to detect the volume, and then determine an appropriate supply voltage to be applied to the amplifier.

To avoid possible audible noise when a low voltage supply is switched to a high voltage supply, a damping circuit is provided in one embodiment to rise from a level of the low voltage supply to a level of the high voltage supply. Likewise, a damping circuit is provided in one embodiment to drop from a level of the high voltage supply to a level of the low voltage supply when a high voltage supply is switched to a low voltage supply.

The present invention may be implemented in many forms including software, hardware or a combination of both. According to one embodiment, the present invention is an electronic device that comprises at least an audio amplifier, a controller, and at least first and second voltages. At any time, only one of the voltages is caused by the controller to energize the audio amplifier in response to a volume so that power consumption of the audio amplifier is controlled without affecting audio quality of the audio amplifier.

According to another embodiment, the present invention is an electronic device that comprises at least an audio amplifier, a controller and a plurality of power supplies. At any time, only one of the power supplies is chosen by the controller to energize the audio amplifier in response to a volume so that power consumption of the audio amplifier is controlled without affecting audio quality of the audio amplifier. Each of the power supplies is designed to have sufficient power wattage to power the amplifier operating under worst case conditions. The worst case includes increased loading from a speaker and/or additional demand for power from high-energy signals like a square wave or severely clipped sinewave.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

FIG. 3B shows that a 14V power supply is immediately replaced by a 36V power supply at t1 when a volume goes beyond a threshold;

FIG. 3C shows that a damping circuit is used to gradually rise from the voltage of the original 14V power supply to a raised voltage of the 36V power supply.

DETAILED DESCRIPTION OF THE PREFERRED EMBODIMENT

The detailed description of the present invention is presented largely in terms of procedures, steps, logic blocks, processing, or other symbolic representations that directly or indirectly resemble the operations of devices or systems that can be used on networks. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 1:
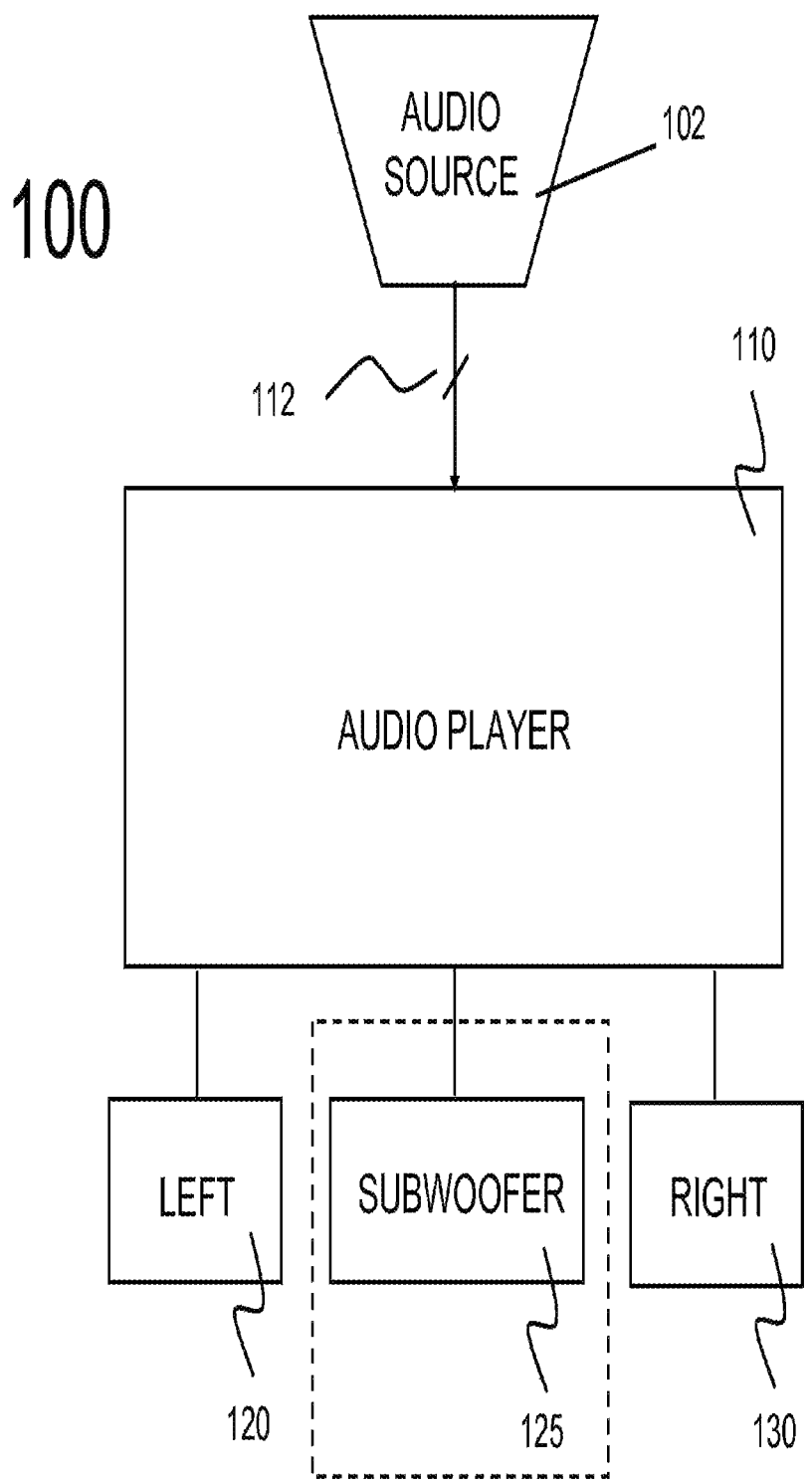
FIG. 1 shows an exemplary configuration in which the present invention may be practiced.

Referring now to the drawings, in which like numerals refer to like parts throughout the several views. FIG. 1 shows an exemplary configuration 100 in which the present invention may be practiced. The configuration may represent, but not be limited to, a part of a sound reproducing device or system, a television set or a home theater system.

To facilitate the understanding of the present invention, it is assumed that the configuration 100 represents an audio player 110 configured to receive an audio source 102 and reproduce sounds therefrom. In one embodiment, the player 110 is coupled to a network that can be wireless or wired, and part of a local area network or a wide area network. The audio source 102, in either analog or digital form, may be locally generated from a source (e.g., a broadcast or a DVD or CD player), downloaded or streamed from another device. As an example, the player 110 is connected to three speakers, a left speaker 120, a right speaker 130 and a subwoofer 125. In operation, the player 110 receives audio sources 102 as an input, processes the input that is then amplified in one or more amplifiers to drive the speakers 120, 125 and 130, where the amplifiers are energized by a power supply.

The efficiency of an amplifier depends largely on its power supply. The inefficiency resulting from operating with a high supply voltage manifests itself as heat in an entire system. The heat generated is undesirable for a number of reasons including: increased power consumption, increased heat-sink cost, reduced reliability, reduced battery life in a portable system, and reduced consumer satisfaction. One of the features, objects and advantages in the present invention is to use multiple supply voltages to energize a power amplifier, so that an appropriate supply voltage is used at all times.

Figure 2A:
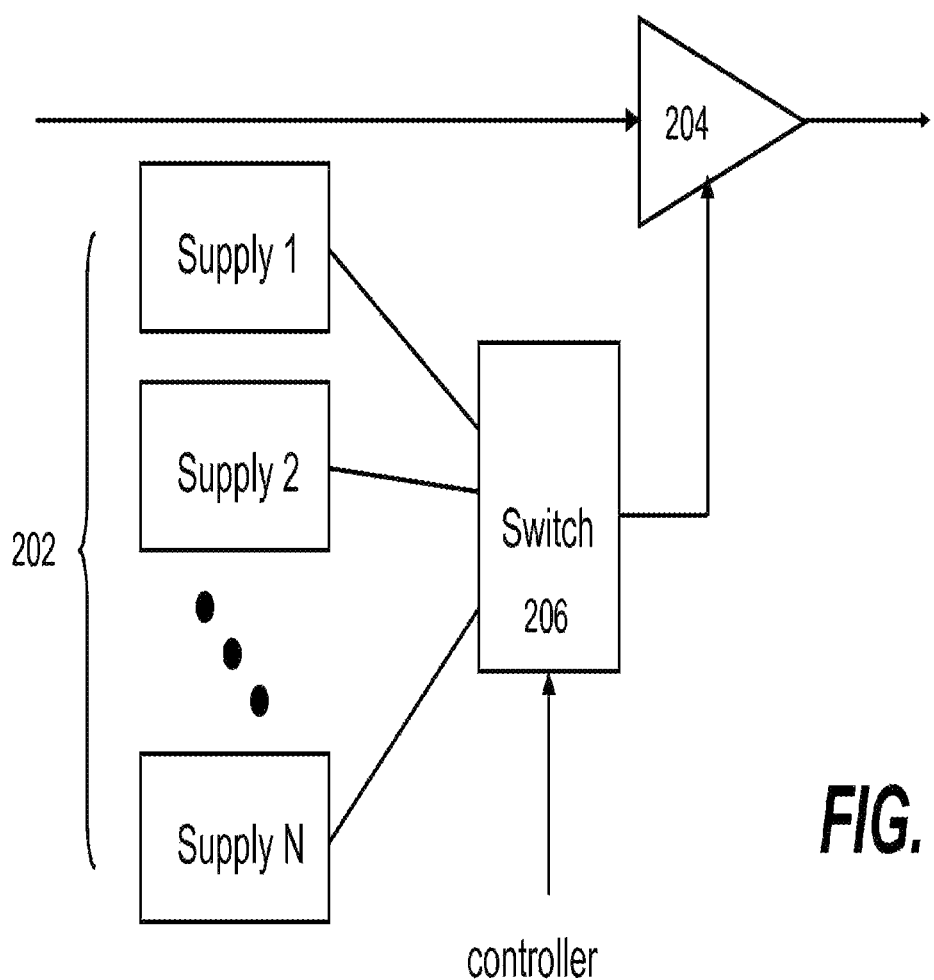
FIG. 2A shows an exemplary functional block diagram of using multiple power supplies to energize an amplifier.

FIG. 2A shows an exemplary functional block diagram 200 of using multiple power supplies 202 to energize an amplifier 204. Depending on implementation, the multiple power supplies 202 may be individual power supplies, a single power supply with a number of output voltages, or a single power supply with variable output voltage. In any case, only one of the power supplies or voltages is used to energize the amplifier in accordance with a desired volume (e.g., volume setting or signal volume) or a range of volume.

Figure 2B:
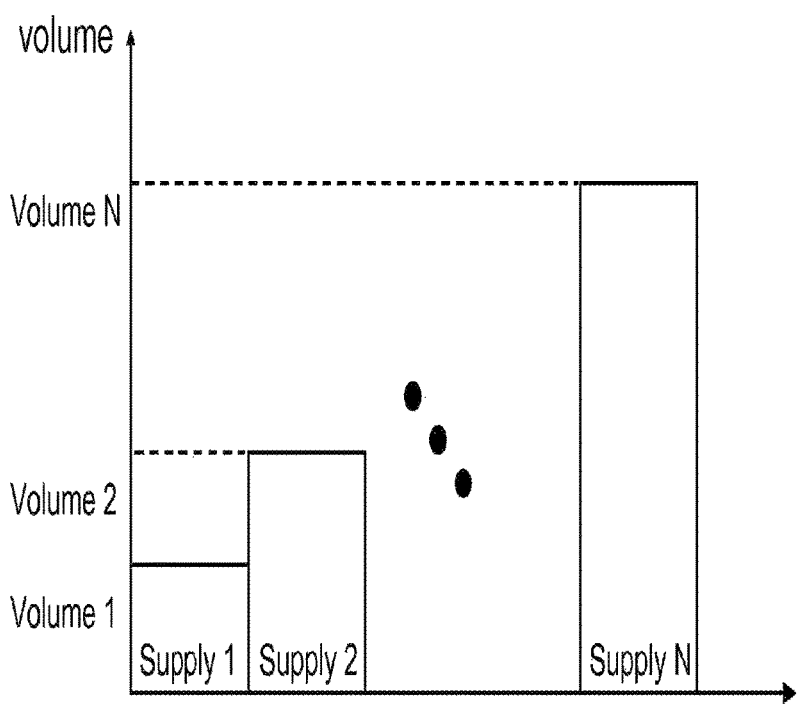
FIG. 2B shows a chart of N supplies, each corresponding to a volume.

FIG. 2A shows that there are N power supplies 202, where N is a finite positive integer (e.g., N=2, 3 or 4). Via a switch 206, one of the N power supplies 202 is coupled to and energizes the amplifier 204 in response to a desired volume, as shown in FIG. 2B. In other words, when a volume is below Volume 1, Supply 1 is used. When the volume goes beyond Volume 1, Supply 2 is automatically switched on to replace Supply 1. If the volume continues to increase, a next supply is automatically switched on until a last supply is used.

In one embodiment, the switch 206 is controlled by a circuit that detects the volume and is configured to determine which one of the power supplies shall be used. In another embodiment, the switch 206 is controlled by a controller that executes a software module in response to a setting of the volume. In yet another embodiment, a software module is configured to scan a digital file of a track to create a power profile so as to optimize the power selection through the track, use a profile already generated to optimize the power supply selection throughout a track; or dynamically "look ahead" in a digital file (either buffered locally or buffered at the transmitting source) to optimize the power supply selection throughout the track.

Figure 3A:
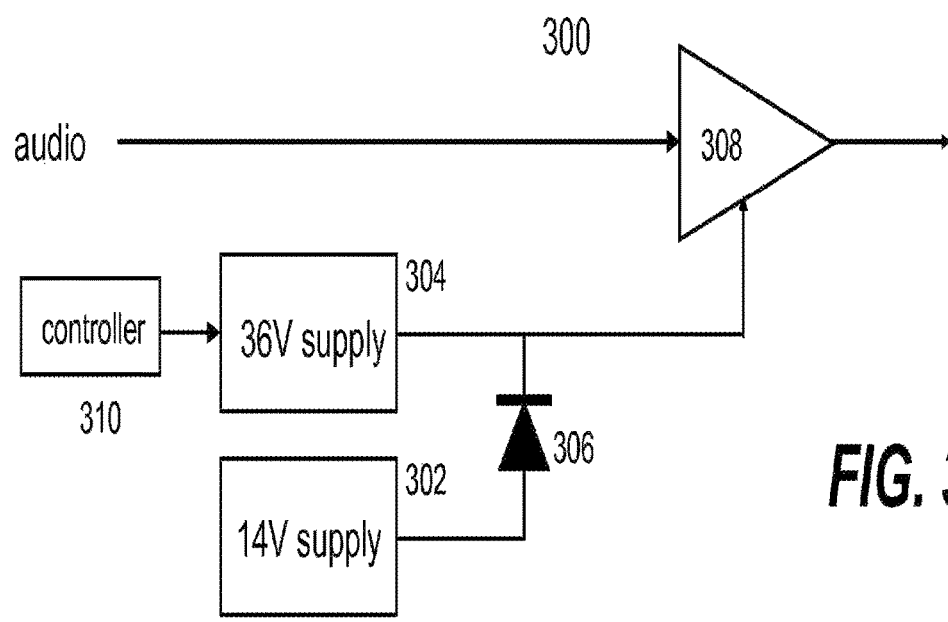
FIG. 3A shows one embodiment employing two power supplies alternatively to energize an amplifier.

To facilitate the description of the present invention, FIG. 3A shows one embodiment 300 employing two power supplies 302 and 304 alternatively to energize an amplifier 308. The power supply 302 is designed to have a voltage 14V, and the power supply 304 is designed to have a voltage 36V. In operation, when the power supply 304 is turned off, a diode 306 is on, thus the power supply 302 is applied to the amplifier 308. When the power supply 304 is turned on, the diode 306 is off, thus the power supply 304 is applied to the amplifier 308. It should be noted that the use of the diode 306 is one of the exemplary switch mechanisms that may be controlled to switch between two power supplies. Other examples of the switch mechanisms may include, but not be limited to, a solid-state switch and a mechanical switch.

Figure 4:
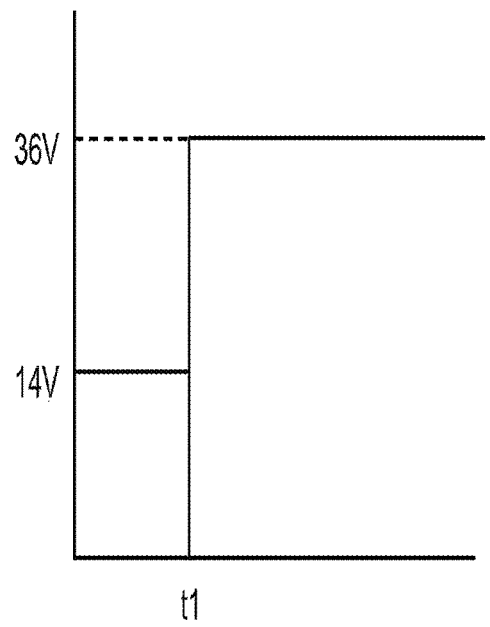
FIG. 4 shows a block diagram of employing one power supply in a prior art system.
Figure 4:
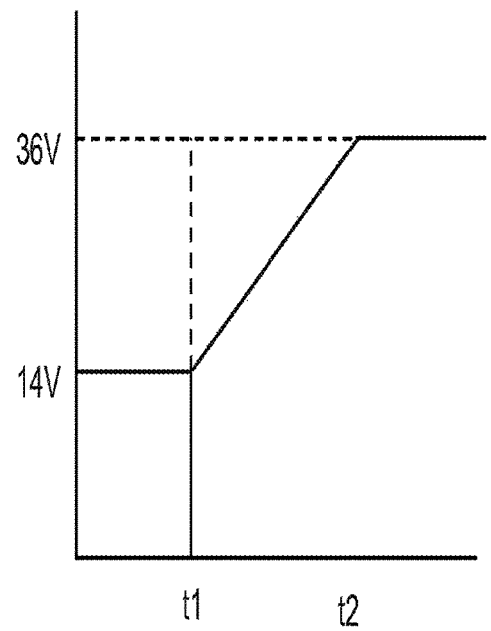
Figure 4:
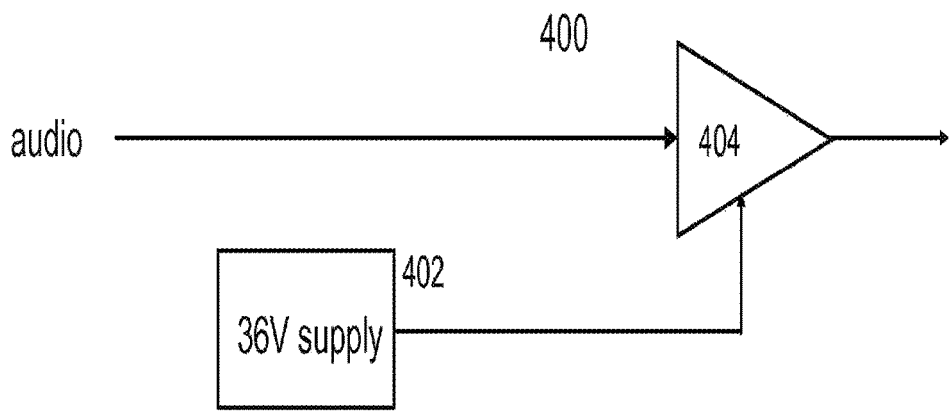

In a test of using a setting 400 commonly seen in a prior art audio device including a single power supply 402 and one or more amplifiers 404, as shown in FIG. 4, it was observed that the internal power dissipation in the audio device remains relatively large when music is played at low volume, resulting in a case temperature in excess of 40° C. in a 25° C. room. In fact, the internal power dissipation changes very little from playing music at low volume to playing nothing at all. In other words, as long as an amplifier is enabled, the power dissipated is nearly the same as that when playing music at low volume. Under this "quiet" condition, operating with a fixed 36V power supply, the power dissipation of the audio amplifier, the 36V power supply, and all other internal circuits totals approximately 17.5 W.

Accordingly, using the two-tier power supply approach of FIG. 3A, the 14V power supply is used to power the audio amplifier at and below a pre-determined volume setting. Beyond this setting, the 36V supply is switched on and only turned off when the setting is below a pre-determined volume. Keeping the 36V power supply off when necessary, there are at least three benefits. First, the power consumption of the 36V power supply goes away completely. Second, the power consumption of the audio amplifier is reduced, owing to a reduced supply voltage. Finally, the bias power to the 36V control circuit is eliminated, including any control circuitry associated with it. Hence, the total power dissipation inside the audio device is reduced from 17.5 W to about 8 W, a savings of 9.5 W, or more than half of the total power dissipation.

For the audio amplifier operating with lower power, it is reasonable to assume that its efficiency is approximately given by:

$$\eta_{LP} \cong \frac{P_O}{P_O + P_{STATIC}}.$$

That is, the low power inefficiency is primarily the result of a static power loss. By "static," it means that this amount of power is consumed by the amplifier regardless of whether it is generating audio or not. With the 14V power supply, the static loss $P_{STATIC}$ can be cut significantly, compared with the static loss at 36V. In one embodiment, this loss is reduced from 5.5 W to 2 W. Using this approximation, the power required by the amplifiers is simply the sum of the static power loss and the speaker output power $$P_{AMP} \sqrt{P_O + P_{STATIC}}$$

In order for the two-tier power supply to be a viable solution in reducing thermal issue in a device, the overall system must be seamless in operation and in transition from one power source to the other and back again. To accomplish this, a power supply must be capable of providing the required power under worst-case conditions. These worst-case conditions include speaker load, controller volume setting, and audio source content. All of these effects shall be considered and may occur simultaneously, so that no system should ever experience a fault in normal operation. To understand the implications of these requirements, an understanding of the power requirements of the audio system is necessary.

Amplifier Gain determines how much output can be expected from an amplifier for a given input signal amplitude. This gain is defined as a ratio of the output voltage between speaker terminals to the input voltage to the amplifier, and expressed as:

$$A_V \equiv \frac{v_{out}}{v_{in}}$$

Volume Setting. Each volume setting corresponds to a multiplier, relative to the maximum output. A table is used to set the volume for each of the possible settings. The table below shows exemplary 100 settings:

```
static const float g__rgfVolTable[g__iVolTableSize] = {
0.0,     ...,  ...,  ...,  ...,  ...,  ...,  ...,  ...,  ...,
...,     ...,  ...,  ...,  ...,  ...,  ...,  ...,  ...,  ...,
...,     ...,  ...,  ...,  ...,  ...,  ...,  ...,  ...,  ...,
...,     ...,  ...,  ...,  ...,  ...,  ...,  ...,  ...,  ...,
...,     ...,  ...,  ...,  ...,  ...,  ...,  ...,  ...,  ...,
...,     ...,  ...,  ...,  ...,  ...,  ...,  ...,  ...,  ...,
0.0398,  ...,  ...,  ...,  ...,  ...,  ...,  ...,  ...,  ...,
0.0891,  ...,  ...,  ...,  ...,  ...,  ...,  ...,  ...,  ...,
...,     ...,  ...,  ...,  ...,  ...,  ...,  ...,  ...,  ...,
...,     ...,  ...,  ...,  ...,  ...,  ...,  ...,  ...,  ...,
1.0000};
```

The two entries in the left column corresponding to volume settings of 60 (0.0398) and 70 (0.0891) are significant in that it is believed that the transition from the 14V power supply to the 36V power supply to the amplifiers shall occur in or near this range. The corresponding output power for these settings is $$P_O = 2 \times (0.0398 \times A_V \times V_{in,max})^2 / Z_{speaker}; \text{volume}=60$$

$$P_O = 2 \times (0.0891 \times A_V \times V_{in,max})^2 / Z_{speaker}; \text{volume}=70$$

The factor of 2 in the above formula accounts for right and left channels, and therefore the total average output power is calculated. The term $V_{in,max}$ refers to the maximum peak-to-peak input voltage to the amplifier. The term $Z_{speaker}$ refers to the impedance of the speaker. It has been assumed in the above calculations that the input signal is a sinusoidal waveform.

Worst-Case Conditions. It may be shown that from a power supply perspective, the worst-case waveform is a square wave, since it consumes the most power for a given signal amplitude. The power in a square wave is twice that of a sine wave of the same peak amplitude. Therefore, it is necessary to increase the power required by a factor of two for the worst-case waveform. Another way of viewing this same requirement is that the peak power in a sine wave is twice the average power. Hence, even if the sine waves are considered, the power supply must be capable of delivering twice the average power, if only for an instant.

The impedance of speakers is known to vary over a wide range, as a function of frequency. An amplifier may be designed to match a particular speaker, where the impedance, as a function of frequency, is known. In this case, the amplifier can be designed to optimize the power supply for that particular speaker. Alternatively, an amplifier may be designed to work with a generic speaker, where the impedance, as a function of frequency, is unknown. In this case, the amplifier is designed to function with the worst-case impedance, as a function of frequency. To summarize these contributions into a single formula based on the above two exemplary settings, the worst-case power requirement for a given volume setting is given by:

$$P_{O,WORST-CASE} = 2 \times (0.0398 \times A_V \times V_{in,max})^2 / Z_{speaker,min};$$
$$\text{volume}=60$$

$$P_{O,WORST-CASE} = 2 \times (0.0891 \times A_V \times V_{in,max})^2 / Z_{speaker,min};$$
$$\text{volume}=70$$

Where $Z_{speaker,min}$ is the minimum impedance exhibited by the speaker over the frequency range of the amplifier. In addition to the proposed requirement of providing audio power at low volume settings, a selected power supply may also be needed to energize other parts in the device.

The impedance of speakers is known to vary over a wide range, as a function of frequency. An amplifier may be designed to work with a generic speaker, where the impedance of the speaker is unknown. In one embodiment, a power supply selected to deliver the requisite power for a speaker with impedance in a worst case. For example, if the minimum impedance in a worst case of a speaker is 2 Ohms over a frequency range of 20 Hz to 20 kHz, then the power supply shall be expected to deliver the requisite power under that condition, and the transition from one supply voltage to another supply voltage will be selected appropriately. Since a power supply is designed to work with generic speakers, the same design must also work for a speaker with the minimum impedance of 8 Ohms. However, if a single transition point (e.g., volume=60) is used for both speakers, then the power supply would be less efficient for the 8 Ohm speaker than the 2 Ohm speaker, resulting in more power loss and increased heat in the 8 Ohm configuration than could be provided if the system was designed specifically to work for the 8 Ohms speaker (instead of the 2 Ohms speaker).

To address the above inefficiency, a configurable parameter is provided to tune the transition point based on the impedance of the attached speakers. This parameter may be determined manually or automatically. In one embodiment, a user is required to make a selection, e.g., using a graphical user interface or a physical switch to select a value, e.g., 2, 4, 6, 8 Ohms. In another embodiment, a circuit is provided to measure an impedance of the speakers connected to the amplifier. The configurable parameter is then provided to a controller to switch to an appropriate power supply.

FIG. 3B shows that a 14V power supply is immediately replaced by a 36V power supply at t1 when a volume goes beyond a threshold. To avoid possible pop-up noise when switching from one power supply to another, an additional circuit is used according to one embodiment. Such a circuit may be coupled to or implemented in the 36V supply 304 of FIG. 3A. FIG. 3C shows that a damping circuit is used to gradually rise from the voltage of the original 14V power supply to a raised voltage of the 36 power supply. The time (t2–t1) to reach the new voltage level may be adjusted depending on the voltage being raised.

In one embodiment, the power supplies are switched in accordance with an audio signal. More than one power supply is used and switched in accordance with the amplitude of an audio signal. If the amplitude is low, a relatively lower power supply is switched on. If the amplitude is high, a relatively higher power supply is switched on. As a result, the power consumption is well controlled. In addition, the designs and costs of heat dissipation can be simplified and lowered in cost.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. For example, a power supply able to produce continuous varying voltages may be used. Thus at any time, the power supply may be controlled to produce an appropriate voltage to be applied on an amplifier. Accordingly, the scope of the present invention is defined by the appended claims rather than the forgoing description of embodiments.

The invention claimed is:

1. An audio device comprising:
an audio input configured to receive an audio signal having an amplitude;
a first voltage source;
a second voltage source;
an amplifier; and
a switch operably coupling the amplifier to the first voltage source, and configured to selectively operate in a first mode and at least a second mode based on the amplitude of the audio signal, wherein:
in the first mode, the amplifier receives electrical power from the first voltage source, and
in the second mode, the amplifier receives electrical power from the second voltage source.

2. The audio device of claim 1, wherein the switch is further configured to operably couple the amplifier to the second voltage source.

3. The audio device of claim 1, wherein the first voltage source is configured to output electric power having a first voltage, wherein the first voltage source is configured to output electric power having a second voltage, and wherein the first voltage is less than the second voltage.

4. The audio device of claim 1, wherein the switch operates in the first mode when the amplitude of the audio signal is less than or equal to a predetermined threshold.

5. The audio device of claim 4, wherein the switch operates in the second mode when the amplitude of the audio signal exceeds the predetermined threshold.

6. The audio device of claim 1, wherein the switch comprises one or more diodes.

7. The audio device of claim 1, further comprising:
a controller configured to detect the amplitude of the audio signal and to determine a supply voltage corresponding to the detected amplitude of the audio signal.

8. The audio device of claim 7, wherein the controller is operably coupled to the switch, and wherein the switch is further configured to selectively operate in the first mode and the second mode based on the determined supply voltage.

9. The audio device of claim 8, wherein the switch is configured to operate in the second mode only if the determined supply voltage exceeds a predetermined threshold voltage.

10. The audio device of claim 7, wherein the controller is operably coupled to the second voltage source, and wherein the second voltage source is configured to output electrical power to the amplifier if the determined supply voltage exceeds a predetermined threshold voltage.

11. The audio device of claim 10, wherein the switch is configured to operate in the first mode in the absence of electrical power output by the second voltage source.

12. The audio device of claim 7, wherein the controller is configured to determine the supply voltage based at least in part on a power profile generated from a digital file associated with the audio signal.

13. The audio device of claim 7, further comprising:
a transducer electrically connected to the amplifier, wherein the transducer has an associated impedance, and wherein the controller is configured to determine the supply voltage based on the impedance associated with the transducer.

14. A method of operating an audio device having an amplifier, the method comprising:
receiving an audio signal;
detecting an amplitude of the audio signal;
determining a supply voltage to apply to the amplifier based on the detected amplitude; and
selectively providing electrical power to the amplifier from a first voltage source and at least a second voltage source in response to the determined supply voltage, wherein the first voltage source is configured to output electrical power having a first voltage, and wherein the second voltage source is configured to output electrical power having a second voltage greater than the first voltage.

15. The method of claim 14, wherein selectively providing the electrical power comprises operating a switch in the audio device in a first mode and at least a second mode based on the determined supply voltage, wherein:
in the first mode, the amplifier receives electrical power from the first voltage source, and
in the second mode, the amplifier receives electrical power from the second voltage source.

16. The method of claim 15, wherein selectively operating the switch further comprises:
   operating the switch in the first mode when the supply voltage is less than or equal to a predetermined threshold; and
   operating the switch in the second mode when the supply voltage exceeds the predetermined threshold.

17. The method of claim 15, wherein selectively operating the switch further comprises:
   operating the switch in the first mode in the absence of electrical power output by the second voltage source.

18. The method of claim 14, wherein determining the supply voltage comprises generating a power profile of a digital file associated with the audio signal.

19. The method of claim 14, wherein selectively operating the switch further comprises operating the switch in the second mode only if the determined supply voltage exceeds a predetermined threshold voltage.

20. A non-transitory computer-readable storage medium storing instructions that, when executed by one or more processors, cause an audio device to perform operations comprising:
   receiving an audio signal;
   detecting an amplitude of the audio signal;
   determining a supply voltage to apply to an amplifier of the audio device based on the detected amplitude; and
   selectively providing electrical power from a first voltage source and at least a second voltage source in response to the determined supply voltage, wherein the first voltage source is configured to output electrical power having a first voltage, and wherein the second voltage source is configured to output electrical power having a second voltage greater than the first voltage.

* * * * *